(12) United States Patent
Giles et al.

(10) Patent No.: US 8,103,924 B2
(45) Date of Patent: Jan. 24, 2012

(54) TEST ACCESS MECHANISM FOR MULTI-CORE PROCESSOR OR OTHER INTEGRATED CIRCUIT

(75) Inventors: Grady L. Giles, Dripping Springs, TX (US); Brian Hoang, Seattle, WA (US); Timothy J. Wood, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 854 days.

(21) Appl. No.: 12/021,455

(22) Filed: Jan. 29, 2008

(65) Prior Publication Data
US 2009/0193303 A1    Jul. 30, 2009

(51) Int. Cl.
*G01R 31/28* (2006.01)

(52) U.S. Cl. .................... 714/726; 714/729; 714/733

(58) Field of Classification Search .............. 714/30, 714/724, 726, 727, 729, 733
See application file for complete search history.

(56) References Cited

U.S. PATENT DOCUMENTS

| | | | | |
|---|---|---|---|---|
| 5,132,635 A * | 7/1992 | Kennedy | .................. | 324/756.05 |
| 5,195,097 A * | 3/1993 | Bogholtz et al. | .............. | 714/743 |
| 6,675,284 B1 | 1/2004 | Warren | | |
| 7,139,947 B2 * | 11/2006 | Miner et al. | .................. | 714/726 |
| 7,356,745 B2 * | 4/2008 | Whetsel | ........................ | 714/726 |
| 7,523,297 B1 | 4/2009 | Mistely | | |
| 7,685,487 B1 * | 3/2010 | Kuo et al. | ..................... | 714/726 |
| 2005/0005217 A1 * | 1/2005 | Whetsel | ........................ | 714/727 |
| 2007/0011535 A1 * | 1/2007 | Anzou et al. | .................. | 714/733 |

* cited by examiner

Primary Examiner — Jeffrey A Gaffin
Assistant Examiner — Daniel McMahon
(74) Attorney, Agent, or Firm — Meyertons, Hood, Kivlin, Kowert & Goetzel, P.C.; Erik A. Heter (57) ABSTRACT

A processor having a pipelined test access mechanism (TAM). The processor includes a plurality of processor cores. Each of the processor cores includes a scan chain including plurality of serially-coupled scan elements. The processor further includes the pipelined TAM, which includes a plurality of pipeline stages each corresponding to one of the plurality of processor cores. The pipelined TAM includes a command channel, a scan data input (SDI) channel, a scan data output (SDO) channel, and a compare channel. Each pipeline stage is operable to convey commands to its corresponding processor core via the command channel, to convey scan input data to its corresponding processor core via the SDI channel, to receive scan output data conveyed from the corresponding processor core to the SDO channel and the compare channel, and convey compare data downstream via the compare channel, wherein the compare data is based on the scan output data.

20 Claims, 6 Drawing Sheets

TEST ACCESS MECHANISM FOR MULTI-CORE PROCESSOR OR OTHER INTEGRATED CIRCUIT

BACKGROUND OF THE INVENTION

1. Field of the Invention

This invention relates to multi-core processors, and more particularly, to access of the multiple cores for testing.

2. Description of the Related Art

Processor designers use many different techniques to increase the speed at which information can be processed. One technique that is increasingly implemented on new processor designs is the use of multiple, identical cores on the same processor. Through the use of multiple identical processor cores, many processing tasks can be divided to allow each core to process a portion of the whole.

As with single core designs, multiple core processors must be tested in order to ensure their readiness for shipping to a customer. A portion of the testing can be accomplished using scan technology. Scan testing utilizes chains of scan elements coupled serially together ('scan chains'). A scan chain is created using the flip-flops (or latches or other clocked storage devices) of a processor. The output of a given flip-flop is coupled to the input of another flip-flop. A large number of flip-flops are connected in this manner, forming a scan chain that passes through the internal logic of the processor. The scan chain may be thought of as a serial shift register, in which values are shifted from one register flop to the next.

In order to test the processor logic using a scan chain, stimulus scan data (i.e. the test data, the test vector, or scan input data) is shifted into the chain, loading each element of the chain with a predetermined value. Following the initial loading, the circuit is then reverted to its normal operating mode, allowing the individual circuits to respond to the scan data. After allowing the circuits a sufficient time to respond, the circuit response scan data (i.e. scan output data) is shifted out of the scan chain, where it is compared with expected results to determine whether the chip is faulty.

In multiple core processors, each identical core may include one or more identical scan chains. Since the cores and the scan chains are identical, it follows that each core, when free of defects, should exhibit a response to a test vector that matches that of other defect-free cores. However, to ensure the processor overall is defect-free, each of the cores must be tested independently of one another. This requirement can greatly increase the time required to conduct a test of the entire processor if the cores are to be tested consecutively. Alternatively, this requirement can increase the required signal space with regard to the input/output pins of the processors in order to provide access to scan chains for each core. Since each core may require multiple scan chains, and since each scan chain requires signal space for scan clock signals, commands, scan data, and so forth, the required signal space can be quite large. Thus, a tradeoff between test time and signal space may be a consequence necessitated by scan testing of processors having multiple identical cores.

SUMMARY OF THE INVENTION

A processor having a pipelined test access mechanism (TAM) is disclosed. In one embodiment, the processor includes a plurality of processor cores, wherein each of the processor cores includes a scan chain having a plurality of serially-coupled scan elements. The processor further includes the pipelined TAM, which includes a plurality of pipeline stages each corresponding to one of the plurality of processor cores. In the case of dual or multiple parallel tracks of pipelined TAMs, each of the parallel stages of the TAM could share a single pipeline register. The pipelined TAM includes a command channel, a scan data input (SDI) channel, a scan data output (SDO) channel, and a compare channel. Each pipeline stage is operable to convey commands to its corresponding processor core via the command channel, to convey scan input data to its corresponding processor core via the SDI channel, to receive scan output data conveyed from the corresponding processor core to the SDO channel and the compare channel, and convey compare data downstream via the compare channel, wherein the compare data is based on the scan output data.

In one embodiment, each pipeline stage includes a command register, an SDI register, an SDO register, and a comparator. The command register is coupled to received commands from upstream in command channel, and is further coupled to convey commands to its corresponding processor core and downstream in the command channel. A command decoder is coupled between the command register and the corresponding processor core. The SDI register is coupled to receive scan input data from upstream in the SDI channel, and is operable to convey the scan input data to its corresponding processor core and downstream in the SDI channel. The SDO register is operable to receive scan output data from its corresponding processor core and is further operable to convey the scan output data downstream in the SDO channel. The comparator is operable to receive scan output data from its corresponding processor core, and is further operable to receive scan output data from upstream in the SDO channel. The comparator is further operable to compare the scan output data from its corresponding processor core to the scan data output received from upstream in the SDO channel in order to generate compare data indicating a result of the comparison and to convey the compare data downstream in the compare channel.

In various embodiments, each pipeline stage also includes match circuitry and a match register. The match circuitry coupled to receive the compare data from the comparator and upstream match data from upstream in the compare channel. The match circuitry is configured to generate downstream match data indicating that the test results of the processor core matches previous test results (e.g., from an upstream processor core). Alternatively, such as in the case depicted in FIG. 4, the match circuitry may indicate the results of the comparison with the expected response. The match register is coupled to receive match data from the match circuitry and further configured to convey the downstream match data in the match channel.

An integrated circuit having a plurality of identical logic units and a pipelined TAM having a plurality of pipeline stages each corresponding to one of the identical logic units is also disclosed. The identical logic units may be processor cores, North bridge units, or other types of identical logic units that may be implemented within a single integrated circuit.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 1:
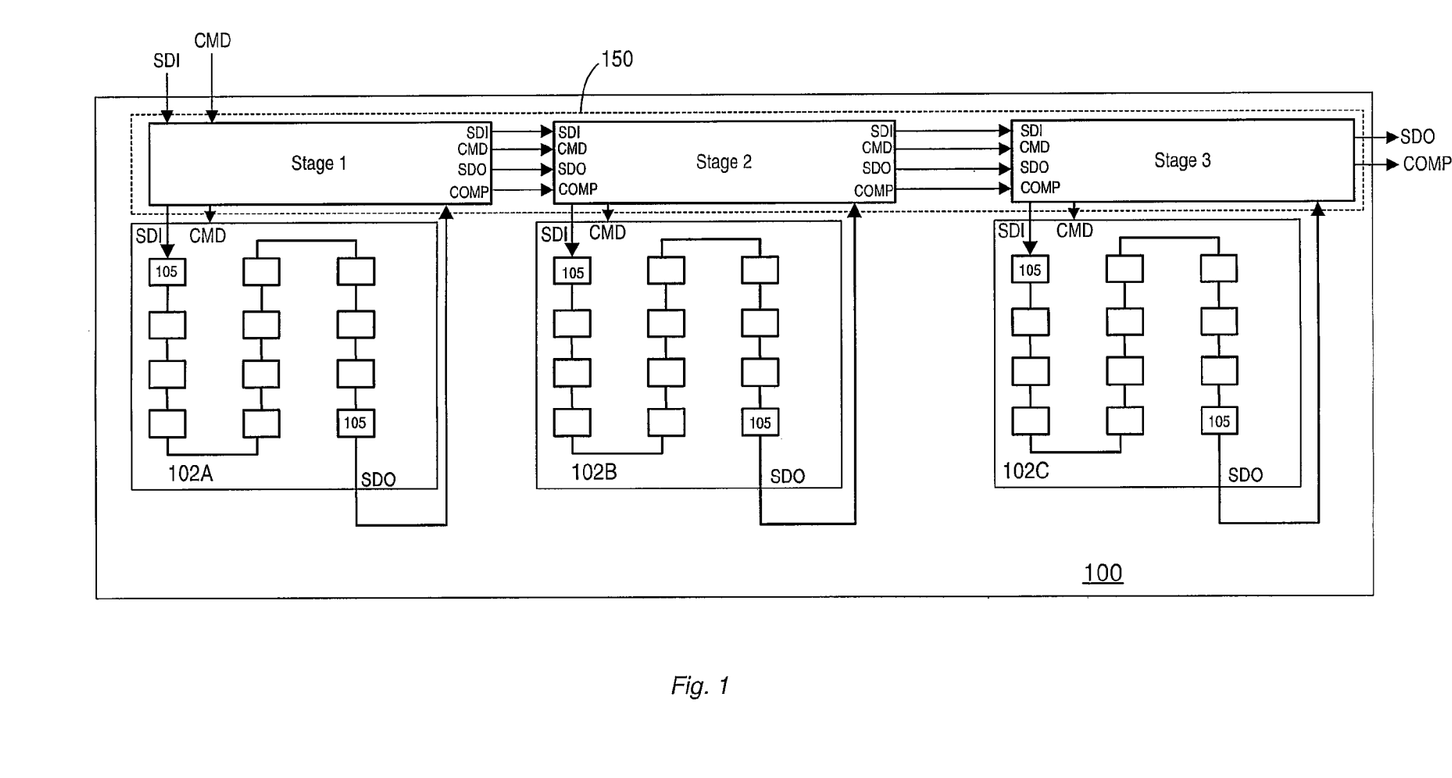
FIG. 1 is a block diagram of one embodiment of a processor having multiple cores and a pipelined test access mechanism (TAM)

Turning now to FIG. 1, a block diagram of one embodiment of a processor having multiple cores and a pipelined test access mechanism (TAM) is shown. In the embodiment shown, processor 100 includes three processor cores (102A, 102B, and 102C), although embodiments with a greater or lesser number of processor cores are also possible and contemplated. Each of the cores 102A, 102B, and 102C, includes at least one scan chain made up of a plurality of serially coupled scan elements 105. Essentially, a scan chain is a long shift register, with extra input and output coupled to the logic circuits to be tested. Although only a single scan chain is shown for each core, it is understood each core may included multiple scan chains (and therefore, multiple corresponding instances of the various components of the pipelined TAM discussed herein). The scan chains may be used to input test vectors into their respective processor core through a corresponding SDI (scan data in) input. After capturing test results into the scan chain, the data representing the test results may be shifted out of each scan chain through a corresponding SDO (scan data out) output. The fundamentals of scan testing are well known in the art, and thus are not discussed in further detail here.

Processor cores 102A, 102B, and 102C are logically identical to one another. These processor cores include typical processor functional circuitry such as execution units (integer, floating point, fixed point, etc.), register files, cache memories, fetch units, arithmetic circuits, branch prediction circuitry, and so forth. In one embodiment, each of the processor cores (and thus the processor itself) conforms to the x86 architecture. However, this disclosure may be applied to multiple core processors of other architectures as well, and is thus not limited to x86. Each of the processor cores 102A, 102B, and 102C includes scan-testable logic circuitry.

Processor 100 includes a test access mechanism (TAM) 150. Test access mechanism 150 is a pipelined apparatus configured to enable the concurrent inputting test data into the scan chains of each of the cores, thereby leveraging the fact that the cores are logically identical. TAM 150 includes a plurality of stages, with each stage corresponding to one of the processor cores. Information may flow downstream through the pipeline, which, for the purposes of this disclosure, is left to right in the drawing (and ergo, upstream would be from right to left). In general, the most upstream portion of the pipeline is where scan input data and commands are input into the processor, while the most downstream portion of the pipeline is where scan output data and compare data are output from the processor. Thus, information flowing downstream within the pipeline can be said to be flowing towards the pipeline stage wherein scan output data and compare data are output from the processor.

The pipelined TAM includes four different channels: an SDI channel, a command channel, an SDO channel, and a compare channel. Information generally flows through these channels in the downstream direction, although there may be some exceptions within individual stages for certain test modes.

The command channel is used to input commands into each of the processor cores. These commands are used during testing to cause shifts, masks, bypasses, and other types of operations.

The SDI channel is used to input scan data, or test vectors into the cores. Test vectors may be applied to each of the cores, with as little as a single clock cycle of delay between each of the pipeline stages. The SDI channel can also be used to provide mask vectors, and in some embodiments, and may also be useful for providing expected scan output data.

The SDO channel may be used to propagate scan output data, although some scan input data may be shifted into this channel for some operations. Within a given pipeline stage, the SDO channel may receive scan output data from the corresponding processor core, from an upstream processor core, or from the SDI channel within the same pipeline stage.

Comparison operations are performed within the compare channel, and results of these comparisons ('compare data') are conveyed within this channel. Various types of comparisons may be performed in this channel. Such comparisons can include comparing the scan output data from two different cores, and so forth. The various comparison modes may be implemented using switching circuitry such as multiplexers. Examples of various compare modes will be discussed at length below.

Test vectors to be applied to each of the processor cores is input into the processor via the SDI channel through the SDI input to processor 100, and into pipeline stage 1 of TAM 150. Commands to be applied to each of the processor cores are input to processor 100 through the CMD input. Thus, instead of separate SDI and CMD inputs for each processor core, the use of TAM 150 enables consolidation of these inputs and therefore requires a smaller pin count.

Each pipeline stage is configured to enable test data to be input to its respective core through that core's SDI input. For example, test vectors can be input into processor core 102A through its corresponding SDI input from stage 1 of TAM 150. Similarly, commands can also be input into processor core 102A through its corresponding CMD input from stage 1 of TAM 150. The test vectors and commands may also be conveyed downstream (i.e. left to right in this particular drawing) from stage 1 to the next pipeline stage. In the three-core embodiment of processor 100 shown in FIG. 1, both stage 1 and stage 2 may convey test vectors and commands downstream to successive pipeline stages (through the SDI and CMD outputs, respectively). Thus, test vectors and commands may be concurrently loaded into the scan chains of each of the processor cores, which results in a significant saving of time over an arrangement wherein test vectors/ commands are loaded into multiple processor cores sequentially. It is noted that there may be a small delay for loading test vectors/commands into cores that are downstream (with respect to the first core) due to the fact that this information must first propagate to successive pipeline stages. However, this delay may be negligible, particularly with respect to loading test vectors into scan chains having a large number of scan elements. The delay may be as little as one clock cycle between the beginning of loading from one stage to the next. For example, a test vector may begin loading into processor core 102B one clock cycle later than it begins loading into processor core 102A. Similarly, commands may be input into each of the processor cores one clock cycle apart.

Each pipeline stage includes SDO (scan data out) and COMP (comparison) outputs that may be conveyed downstream. Stages downstream from stage 1 also include corresponding inputs coupled to receive information through the SDO and COMP signal paths. Using these paths, scan output data captured during a test can be conveyed downstream for comparison in the next stage or for output to a test system for further analysis. The pipeline stages are configured to enable comparisons of captured scan output data among the cores. This may eliminate the need to output captured scan output data for each individual core, thereby resulting in significant time and signal space savings. Details regarding the comparison of captured scan output data and the various modes under which comparisons may be performed will be discussed in further detail below.

In general, the arrangement shown here is scalable, and the number of pipeline stages that can be implemented is limited only by the number of processor cores (or other scan testable logic units) that may be implemented on the same chip. It is also noted that the arrangement used herein can be used with logic units other than processor cores. For example, a processor or other integrated circuit implementing multiple northbridge units could also implement the TAM in order to input scan data and commands, or output captured test data and comparison data.

Figure 2:
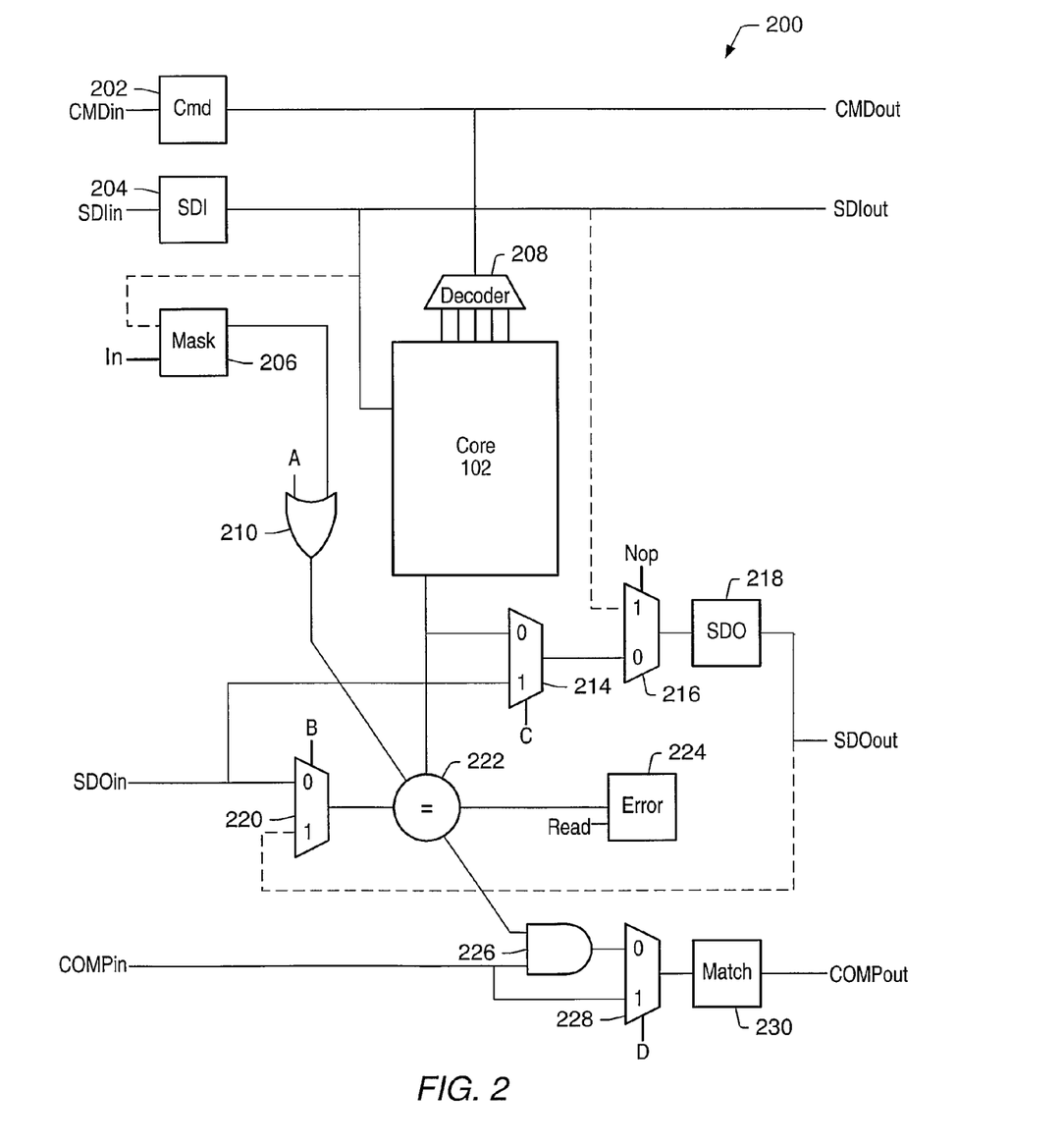
FIG. 2 is a block diagram illustrating one embodiment of a stage of a pipelined TAM and its corresponding processor core.

FIG. 2 is a block diagram illustrating one embodiment of a stage of a pipelined TAM and its corresponding processor core. More particularly, FIG. 2 shows the various parts of a pipeline stage 200, along with an associated processor core 102.

Commands may be conveyed from command register 202 to processor core 102 via decoder 208, which is configured to perform decoding of the commands. Decoding results in the commands being converted into a form usable by processor core 102. Decoded commands received by processor core 102 may cause various operations to take place. Some representative operations are listed below in Table 1, although it is to be understood that a particular command set can vary with different embodiments, and may include commands other than those listed, as well as excluding some of the listed commands.

TABLE 1

| Command | Operation |
| --- | --- |
| Shift | Shift core scan chains; record any SDO channel miscompares in error register |
| First Pattern Shift | Shift core scan chains; reset core error register |
| Shift and Clear Mask | Shift core scan chains; record any SDO channel miscompares in error register; clear the mask register |
| Load Mask | Do nothing to core; move data from the SDI |

TABLE 1-continued

| Command | Operation |
| --- | --- |
| | channel to the mask register |
| Capture | Trigger an at-speed capture sequence in the core |
| NOP | Do nothing to core; move the data from the SDI channel to the SDO channel |

The operations referenced in Table 1 will become evident with the description below of various additional elements of pipeline stage 200. Although the connections are not explicitly shown, command information may also be provided to the NOP input of multiplexer 216 and the dangling input ('In') of mask register 206.

In the embodiment shown, scan input data (i.e. test vectors) and commands are input into pipeline stage 200 through the SDIin and CMDin inputs, respectively. Pipeline stage 200 includes a scan data register, SDI register 204, configured to store received scan data and command register 202 configured to store received commands. From the SDI register 204, scan data can be propagated both downstream (through the output, SDIout) and to processor core 102, to be input into a scan chain within the processor core, similar to that shown in FIG. 1. Scan data can also bypass the core, instead being shifted into mask register 206. This bypass is performed by conveying scan data along the dashed line to mask register 206, and is useful when it is desirable to mask portions of a test vector. Although not explicitly shown, the SDI path between SDI register 204 and mask register 206 may include switching circuitry to cause the scan data to bypass core 102 when shifting to the mask register.

Scan data may also bypass the core and be shifted directly to the SDO channel. In the embodiment shown, this is accomplished by conveying the scan data along the signal path represented by the dashed line that terminates at one of the inputs of multiplexer 216. When the NOP signal is asserted, multiplexer 216 is transparent to convey scan data from SDI register 204 to SDO register 218. When time-multiplexing the use of the SDI channel, the SDO channel is idle for some cycles. During those idle cycles, the SDO channel (and more particularly, SDO register 218) can be used to temporarily store alternate (i.e. non-SDI data) that is input through the SDI channel. In an alternate embodiment, a separate register to store non-SDI data input through the SDI channel could be provided.

As with the signal path to mask register 206, the SDI channel may include switching circuitry that causes scan data to bypass core 102 when being conveyed to multiplexer 216. The switching circuitry is not shown here for the sake of simplicity, although its presence is to be understood.

SDO register 218 is in the SDO portion of the pipeline, and is coupled to receive data from one of three different sources. The first of these sources is the SDI channel, via the '1' input of multiplexer 216. The second of these sources if from processor core 102, via the '0' inputs of multiplexers 214 and 216. The third of these sources is from an upstream pipeline stage, via the '1' input of multiplexer 214 and the '0' input of multiplexer 216. SDO register 218 can also be coupled to provide data stored therein to multiplexer 220 via the signal path shown by the dashed line (and switching circuitry, which is not shown but whose presence is understood). Data stored in SDO register 218 can also be propagated downstream to a subsequent pipeline stage (or to an output of the chip) via the output SDOout.

Pipeline stage 200 includes a comparator 222, which provides a point of entry into the compare channel. Comparator 222 is coupled to receive data from 3 different sources: from OR gate(s) 210, from multiplexer 220, and from processor core 102. Comparator 222 is configured to perform various types of comparisons of scan output data to check for the presence of errors. If it is desired to mask data (and thus ignore any potential errors), comparator 222 may be conditioned with a mask value. The mask value may be received from OR gate 210, which in turn is coupled to receive masking data from mask register 206. The masking data is OR'ed with control signal A to provide a masking value to comparator 222, indicating whether or not any detected errors should be recorded or ignored. In one embodiment, a logic '1' received from OR gate 210 conditions comparator 222 to disable the corresponding bit positions from mismatching, thereby preventing an error from being recorded. Thus, control signal A can be provided to OR gate(s) 210 as a logic '1' or a logic '0', as necessary, to cause a logic '1' to be provided to comparator 222 when it is desirable or necessary to mask a particular bit position.

The input from mask register 206 may be a plurality of some number of K bits, and each of these K bits may be individually ORed with a single control signal A to generate a second plurality of K bits. Thus, although only a single OR gate 210 is shown (again, for the sake of simplicity), pipeline stage 200 may actually include a plurality of K OR gates 210. The second plurality of K bits may be provided to comparator 222 in order to mask certain bit positions.

For bit positions that are not masked, comparator 222 is configured to assert a signal that is provided to an error register 224 in order to record any detected errors. In one embodiment, bits stored in error register 224 are "sticky", i.e. these bits record if any mismatch occurred for the entire test application sequence. Error register 224 also includes a read output that provides access thereto, thereby enabling the checking of its contents at the conclusion of a test sequence.

In addition to providing an output to error register 224, comparator 222 is also coupled to provide an output to AND gate 226 in the compare channel. The other input of AND gate 226 is coupled to receive signal from upstream in the pipeline through the input, COMPin. AND gate 226 is configured to perform a logical AND operation on the upstream compare value received via the input COMPin, and the output of comparator 222. In one embodiment, comparator 222 is configured to provide a logic '1' to AND gate 226 when no error is detected. Accordingly, if the upstream compare value is also a logic '1', the logical AND performed by AND gate 226 will provide a logic '1' output, thereby indicating that, for the particular bit position being compared, the upstream results were the same as those for the present pipeline stage. In other words, AND gate 226 may operate as match circuitry, indicating whether the results from an upstream pipeline stage match the results of the present pipeline stage.

Multiplexer 228 is configured to receive, on its '0' input, the output from AND gate 226. The data received via the input COMPin can also bypass AND gate 226 via the '1' input of multiplexer 228. Match register 230 is coupled to receive the output from multiplexer 228. In test modes wherein the present pipeline stage is to be compared with results from an upstream pipeline stage, the control signal D may be set to cause multiplexer 228 to select the '0' input to be transparent to the input of match register 230. If the present pipeline stage is to be bypassed, control signal D may be set to cause multiplexer 228 to select the '1' input, thereby allowing data received in the compare channel from an upstream pipeline stage to be transparent to the input of match register 230. Data is propagated downstream in the compare channel from match register 230 via the output COMPout.

For the most upstream pipeline stage (e.g., stage 1 in FIG. 1), the input COMPin may be hardwired to a predetermined logic value (e.g. a logic '1') since there are no further stages upstream. Hardwiring the input COMPin for the stage furthest upstream in the pipeline thus enables AND gate 226 to place a value into the compare channel indicating whether errors have been detected in that stage, and thereby provides a basis for comparison with the next pipeline stage. Alternatively, AND gate 226 and multiplexer 228 can be eliminated from the most upstream pipeline stage, with the output of comparator 222 being directly wired to the input of match register 230. In another alternative, an input may be provided on the chip to externally input data into the match channel in order to condition it in a desired manner.

It should be noted that, in various embodiments, the values stored in the command, SDI, SDO, and match registers, may be overwritten by new values as test operations progress. For example, during the loading of scan input data, the value stored in the SDI register of a given pipeline stage is overwritten as the scan input data is shifted into and through the pipeline. In one embodiment, these registers may be implemented with standard master-slave flip-flops, wherein new data is latched into a master stage of the flip-flop while stored data is propagated downstream from the slave stage. The command registers may include multiple flip-flops to accommodate multiple bit positions, since each command comprises a plurality of bits. Furthermore, since many processor cores include multiple scan chains, registers such as the SDI, SDO, and match registers may also include multiple bit positions that each correspond to one of the scan chains.

Considering the embodiments where multiple scan chains are present, there may be a trade-off between signal space and diagnostic resolution. For example, if there are 32 separate scan chains (and thus, for example, the SDO channel is 32 bits wide), a single 32-bit comparator having a single output could be used, with the single input indicating when a mismatch occurs for any one or more of the 32 scan chains. Such an embodiment has the advantage of a smaller signal space, but has a lower diagnostic resolution.

Alternatively, one could implement four 8-bit comparators, one for each of the four 8-bit fields that make up 32 bit width of the SDO channels. Each of the four 8-bit comparators could provide its own unique output to indicate if a mismatch occurs in any one or more of its corresponding scan chains. Thus, if only one scan chain of 32 produced a mismatch in such an embodiment, the source of the mismatch could be narrowed down to one of 8 different scan chains. This alternative would provide gains in diagnostic resolution over the embodiment discussed in the previous paragraph, but requires additional signal space.

For the highest possible resolution, a unique comparator could be provided for each of the scan chains, thereby allowing any mismatches to be traced to the specific scan chain in which it occurred. Such an embodiment would require the most signal space for the number of scan chains, but as noted, would also provide the best resolution.

Figure 3:
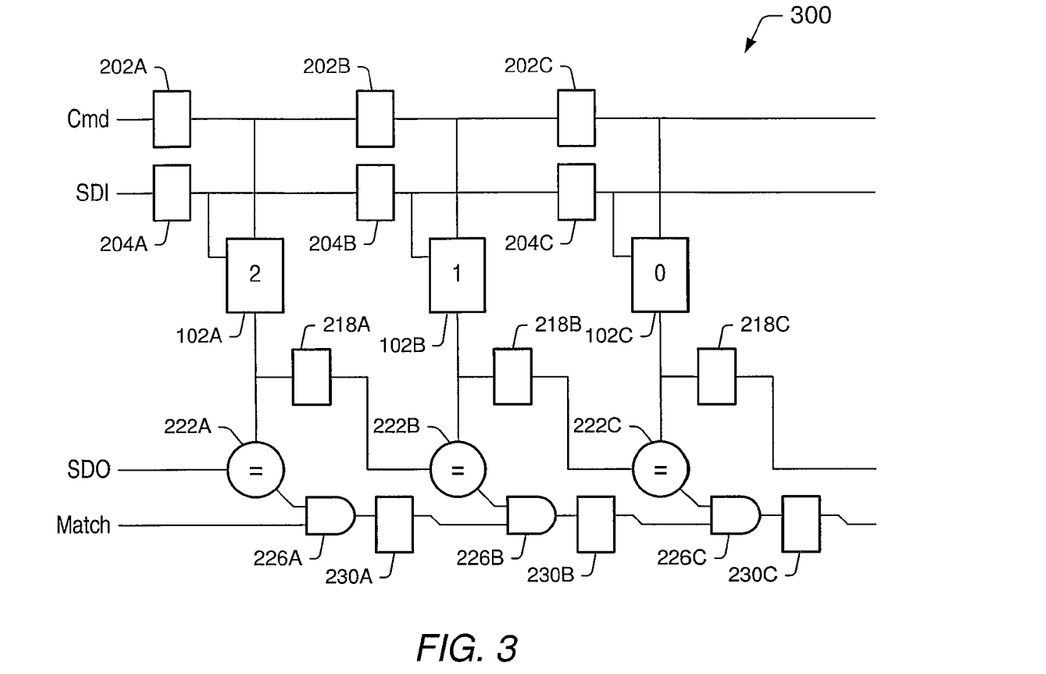
FIG. 3 is a block diagram illustrating a basic architecture of one embodiment of a pipelined TAM and the corresponding processor cores.

Moving now to FIG. 3, a block diagram illustrating a basic architecture of one embodiment of a pipelined TAM and the corresponding processor cores is shown. In this example, as well as the subsequent examples, some components discussed above are not explicitly shown here (e.g., the error registers, multiplexers, etc.) for the sake of simplicity. However, it is understood that these components may still be present in the various pipeline stages.

In the particular embodiment shown, configuration 300 includes three processor cores—102A, 102B, and 102C—and thus three pipeline stages. In this configuration, scan input data is input into SDI register 204A, while commands are input into command register 202A. Each bit of scan input data is shifted into processor core 102A and also propagate downstream to SDI register 204B on the same clock cycle. One clock cycle later, scan input data is shifted into processor core 102 and propagated downstream to SDI register 204C. This process repeats itself until scan input data has been fully shifted into each of the processor cores. Commands are conveyed to each of the processor cores in a similar manner.

After testing has been conducted and scan output data has been captured, the shifting of scan output data and determination of test results may be performed. In the first (i.e. most upstream stage) of the pipeline shown in configuration 300, scan output data may be shifted into comparator 222A, while expected scan output data may be shifted into the SDO channel to comparator 222A from a source external to the chip. Comparator 222A may compare the scan output data received from core 102A with the expected scan output data received via the SDO channel on a cycle-by-cycle basis. In each cycle the scan output data matches the expected scan output data, comparator 222A provides a logic '1' to AND gate 226A. In this embodiment, the match input into the compare channel may either by hardwired to a logic '1', or may be provided as a logic '1' through an external input. Thus, for each cycle when the expected scan output data matches the scan output data received from processor core 102A, AND gate 226A provides a logic '1' to match register 230A.

Scan output data from processor core 102A is also propagated to SDO register 218A on a cycle-by-cycle basis. This data is then propagated downstream in the SDO channel to comparator 222B, where is can be compared to scan output data received from processor core 102B. If the scan output data from processor core 102B matches that output by processor core 102A, comparator 222B asserts a logic '1' that is provided to AND gate 226B. Match data from upstream in the compare channel is also be received for the corresponding cycle from match register 230A. If the upstream comparison produced a logic '1' (meaning that expected scan output data matched the scan output data received from processor core 102A), and scan output data from both processor cores 102A and 102B match, then both inputs to AND gate 226B are logic '1's, thereby resulting in logic '1' being propagated to match register 230B and, subsequently, downstream in the compare channel. The operations described herein are the same in the third pipeline stage, comparing scan output data from processor cores 102B and 102C, with its corresponding result being compared with upstream match results received via the compare channel.

Since comparisons are performed on a cycle-by-cycle basis, any mismatch of unmasked scan output data will result in a logic '0' being introduced into the compare channel. This logic '0' will then propagate through the compare channel and through each pipeline stage until shifted out of the chip for external observation. Similarly, in configuration 300, scan output data from processor core 102C is also shifted out of the chip through the SDO channel.

Figure 4:
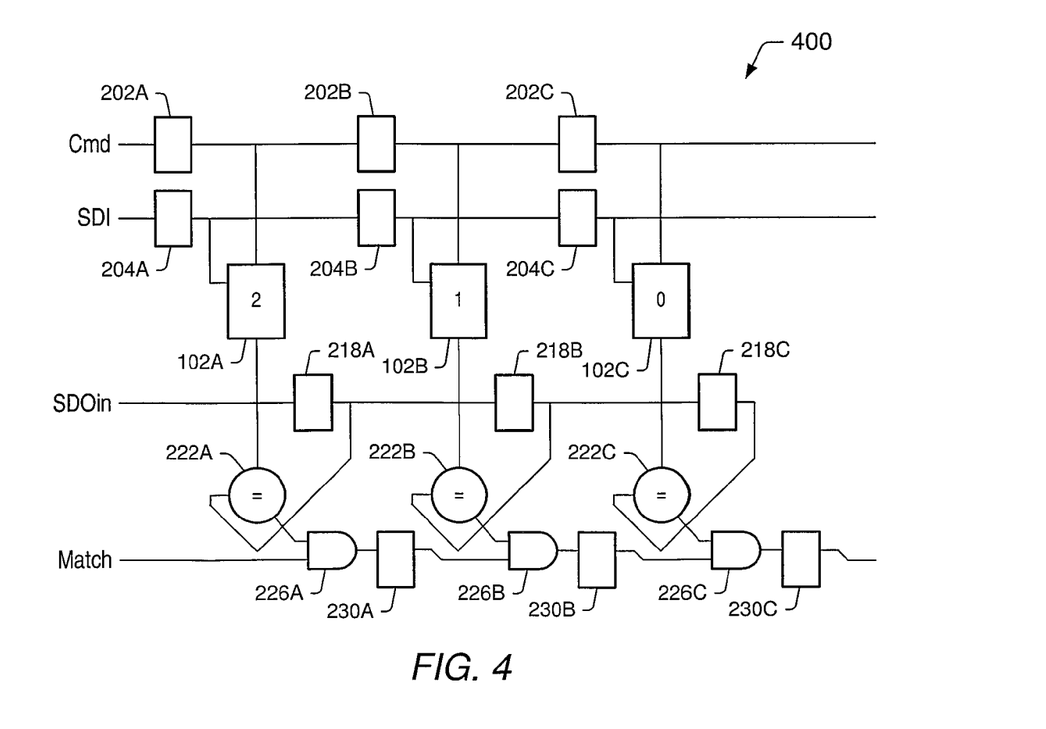
FIG. 4 is a block diagram illustrating a configuration of a pipelined TAM and corresponding processor cores when operating in a self-compare mode.

FIG. 4 is a block diagram illustrating a configuration of a pipelined TAM and corresponding processor cores when operating in a self-compare mode. The particular mode of operation for configuration 400 may be referred to as a full-rate self-compare mode. Referring momentarily back to FIG. 2, configuration 400 is accomplished by setting control signals B and C for each pipeline stage to a logic '1', thereby causing multiplexers 214 and 220 to select their respective '1' inputs to be transparent to their corresponding outputs. This results in the output of each of the SDO registers 218 being provided as one input to its respective comparator 222, with scan output data from the respective processor core 102 being provided as another input. For example, in the most upstream stage of configuration 400, the inputs to comparator 222A include scan output data provided directly from processor core 102 and data provided from SDO register 218A.

When operating in the full-rate self-compare mode of configuration 400, expected scan output data is input into the SDO channel from an external source. Expected scan output data is propagated through the SDO channel to each pipeline stage on a cycle-by-cycle basis. The expected scan output data in each stage is compared with the actual scan output data received from its corresponding processor core, also on a cycle-by-cycle basis. Any mismatches between the expected scan output data and the actual scan output data for a given processor core will result in the insertion of a logic '0' into the compare channel, via that pipeline stage's corresponding AND gate 226. This logic '0' will propagate through the compare channel to its eventual output from the chip, thereby providing an indication that a test has resulted in an error for at least one of the processor cores.

Conducting testing in the full-rate self-compare mode may provide a way to concurrently test all of the processor cores without having to separately shift out scan output data for each core. The number of cycles required to complete the shifting out of scan output data for all of the cores of a processor in this mode can be expressed as X=N+M, wherein X=the total number of cycles, N=the number of cycles to shift out scan output data for a single processor core, and M equals the number of additional cores (e.g., for a 3-core embodiment, M=2, for a 4-core embodiment, M=3, and so on). A similar formula can be applied for the inputting of scan input data and commands. Accordingly, a multi-core processor could initially be tested in the full-rate self-compare mode. If the initial test produces a passing result, multiple processor cores will have been tested in a time that is negligibly greater than the amount of time it would take to perform scan testing of a single core. Considering the length of the scan chains in modern microprocessor cores, this time savings can be significant. Thus, TAM 150 as disclosed herein may effectively leverages the fact that the processor cores (or other type of logic units) are identical.

Figure 5A:
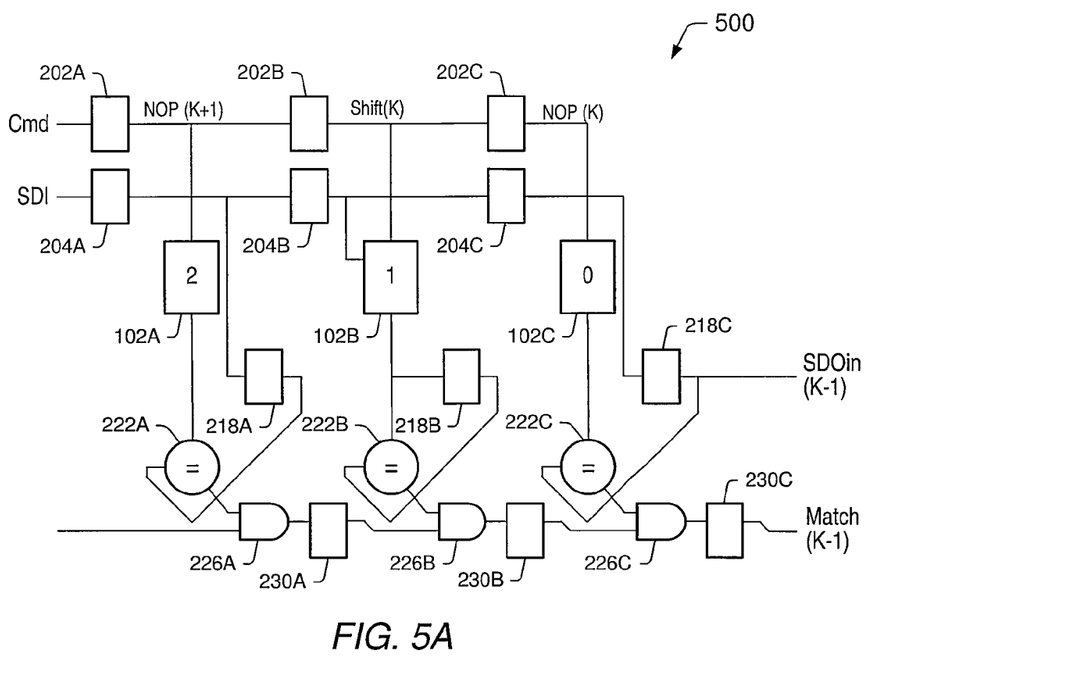
FIGS. 5A and 5B are block diagrams illustrating configurations of a pipelined TAM and corresponding processor cores for two cycles of operation in an interleaved self-compare mode.
Figure 5B:
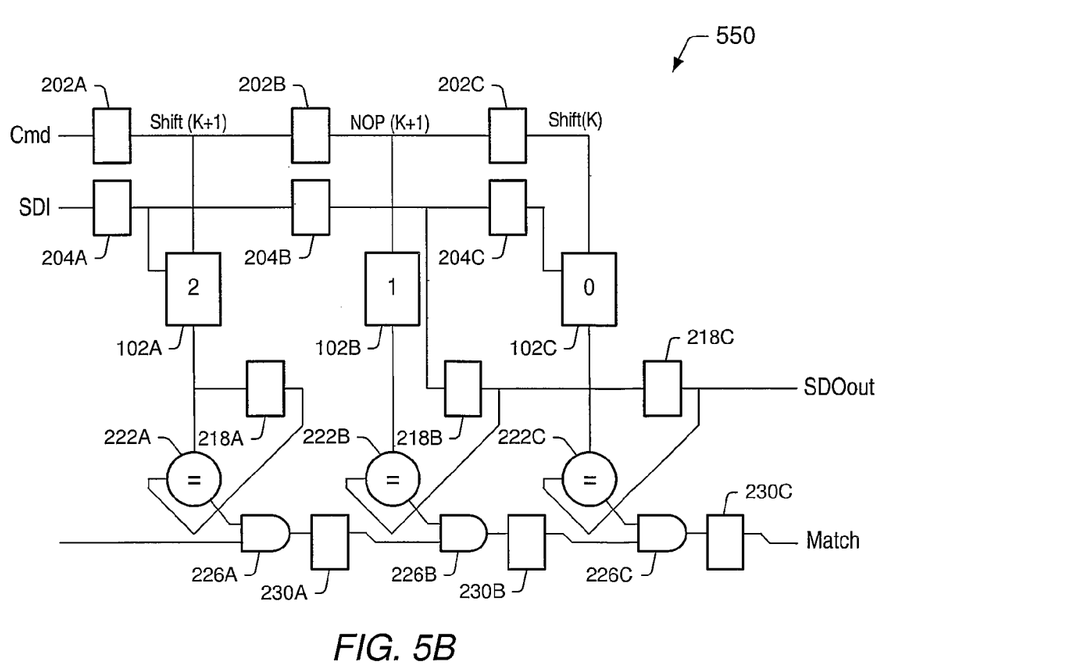

FIGS. 5A and 5B are block diagrams illustrating configurations of a pipelined TAM and corresponding processor cores for two cycles of operation in an interleaved self-compare mode. In the full-rate self-compare mode described above, the conventional protocol of scan test pattern application can be described as shift, shift, . . . shift, capture, shift, shift, etc. In the interleaved self-compare mode to be described in conjunction with FIGS. 5A and 5B, the protocol for scan test pattern application can be described as NOP (no operation), shift, NOP, shift, . . . NOP, shift, Capture, NOP, Shift, NOP, shift, etc. On each of the NOP cycles for a given stage, data from the SDI channel is loaded into that stage's SDO register. For example, in FIG. 5A, the processor is shown with the TAM in configuration 500, with the first and third stages configured for no operation, or NOP. The output of SDI register 204A is transparent to the input of SDO register 218A, and thus data from the SDI channel is input into the SDO channel in this stage. Similarly, in the third stage, the output of SDI register 204C is transparent to SDO register 218C, thereby providing data from the SDI channel to the SDO channel. In the second stage, scan data is shifted into core 102B from SDI register 204B, while one of the inputs of comparator 222B is transparent to the output of SDO register 218B.

In the next cycle of operation, depicted in FIG. 5B as configuration 550, the output of SDI register 204B is transparent to the input of SDO register 218B. The output of SDO register 218B is transparent both to one of the inputs of comparator 222B, as well as to the input of SDO register 218C, thereby enabling the direct observation of processor core 218B. During the same cycle, scan data is shifted into processor core 102A from SDI register 204A, and into processor core 102C from SDI register 204C. Thus, through in the interleave self-compare mode, the response of one of processor core 102B is selected for direct observation, while each of the cores also performs self-compare operations. In general, the interleave self-compare mode may be used to select any one of the processor cores for direct observation through the selection of the appropriate multiplexer inputs, while each of the stages will also undergo self-compare operations. Expected scan output data is input through the SDI channel and eventually provided to the comparators 222 for comparison with scan output data from their respective processor cores. Any mismatches are propagated into the compare channel and eventually output from the chip, while each match register will store an indication of whether or not a mismatch was detected in its corresponding stage. The interleave self-compare mode is capable of providing a pass/fail determination for N processor cores individually in the time it take to test two cores serially, for a throughput increase of NX/2.

Figure 6:
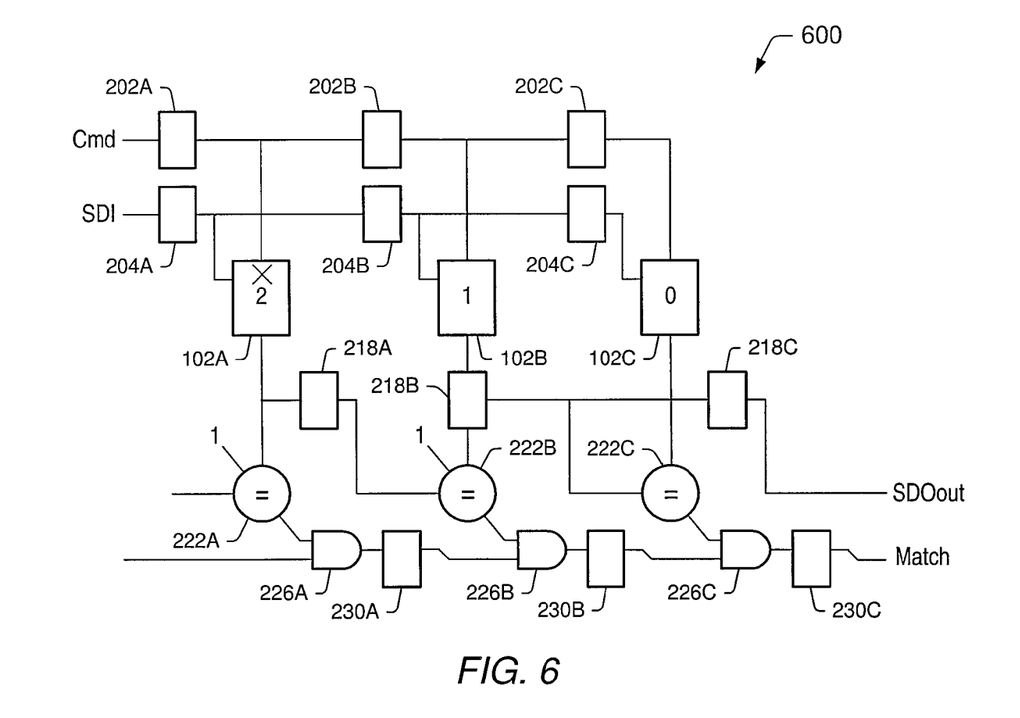
FIG. 6 is a block diagram illustrating a configuration of a pipelined TAM and corresponding processor cores when operating in an inter-core compare mode.

FIG. 6 is a block diagram illustrating a configuration of a pipelined TAM and corresponding processor cores when operating in an inter-core compare mode. When the pipelined TAM is in configuration 600, scan output data from processor core 102B is directly compared to scan output data from processor core 102C. In this particular example, it has been determined that testing of processor core 102A has resulted in an error. Accordingly, a logic 1 is provided to the mask inputs of each of comparators 222A and 222B to prevent any mismatches from entering the compare channels in those two pipeline stages. SDO register 218B is coupled to scan output data from processor core 102B. The output of SDO register 218B is transparent to one of the inputs of comparator 222C. Scan output data from processor core 102C is provided to another input of comparator 222C. Thus, comparator 222C compares the scan output data from processor core 102B to that of processor core 102C on a cycle-by-cycle basis in configuration 600. If a mismatch occurs between data from the two different processor cores, a logic '0' is introduced into the compare channel by comparator 222C, and propagated to the match output of the chip. The mismatch is also recorded in the error register (not shown) coupled to comparator 222C.

In addition to configuration 600 resulting in the direct comparison of scan output data from processor cores 102B and 102C, this particular configuration also enables the direct observation of scan output data from processor core 102B. The output of SDO register 218B, in addition to being transparent to one of the inputs of comparator 222C, is also transparent to the input of SDO register 218C. Thus, scan output data from processor core 102B can be shifted out of the chip through the output SDOout, where it can be compared to expected scan output data. Therefore, in addition to detecting mismatches, directly observing one of the two cores compared to each other enables detection of the failing core for each mismatch.

In general, the pipelined TAM may be configured to allow any two processor cores to be directly compared against each other in inter-core compare mode, and thus configuration 600 is but one possible example among the variations possible. The number of possible configurations is limited only by the number of processor cores implemented within a given chip. In addition to being able to compare the scan output data from any two cores, this mode of operation allows for the direct observation of the scan output data from one of the cores involved in the comparison, thereby allowing the determination of which core is faulty if any mismatches occur.

Figure 7:
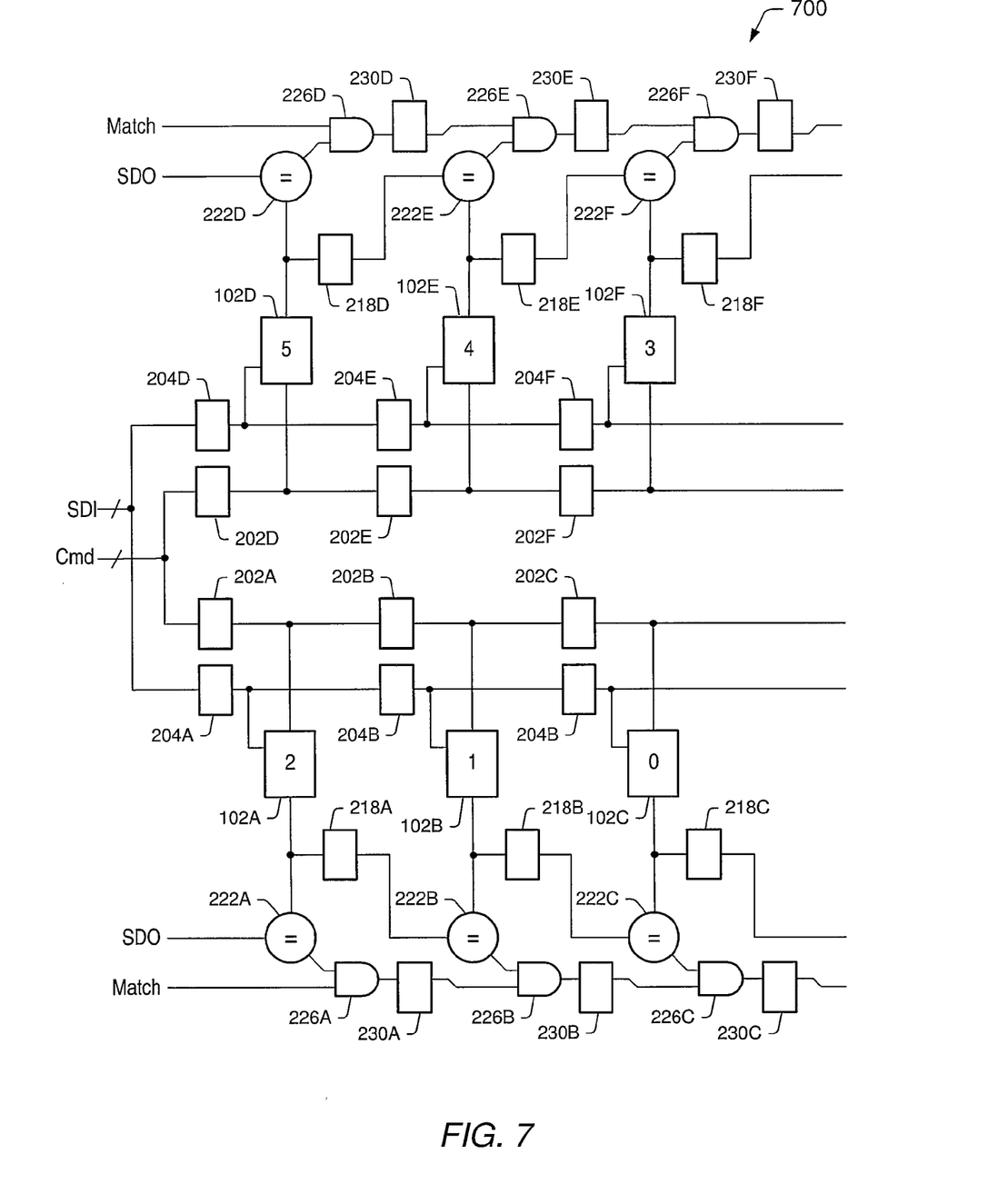
FIG. 7 is a block diagram illustrating another embodiment of a pipelined TAM architecture, in this case for a processor having six cores and two separate, parallel pipelines.

FIG. 7 is a block diagram illustrating another embodiment of a pipelined TAM architecture, in this case for a processor having six cores and two separate, parallel pipelines. Generally speaking, configuration 700 is similar to that of configuration 300 shown in FIG. 2, except in that it is repeated for two separate, parallel pipelines. In the embodiment shown, these pipelines share both SDI and command inputs (and therefore, have common access to the SDI and command channels), but have separate outputs for one or both of the SDO and compare channels. Alternate embodiments are possible and contemplated wherein outputs between the two separate pipelines are combined for the SDO and compare channels. The two pipelines may operate in parallel, and thus testing of the six processor cores shown may be performed in the same amount of time that three processor cores are tested for a single pipeline. It is also noted that, while the configuration 700 conforms with the inter-core compare mode, the two pipelines can be configured to be operated in any of the other modes discussed above. In some embodiments, the two separate pipelines may be operated in different modes. For example, the uppermost pipeline shown in FIG. 7 could be configured and operated in the full-rate self-compare mode, while the bottom-most pipeline could be operated in another mode, such as the compare mode shown in FIG. 3, or the inter-core compare mode illustrated in FIG. 6.

While reference has been made throughout the specification to certain logic values (e.g., a comparator 222 propagating a logic '0' into the compare channel), it is noted that these logic values are exemplary. Other logic values may be used in accordance with the specific implementation of the pipelined TAM, and thus the scope of the claims are not limited by the descriptions involving specific logic values or states.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A processor comprising:
a plurality of processor cores, wherein each of the plurality of processor cores is identical to one another, wherein each of the plurality of processor cores includes a scan chain having a plurality of serially-coupled scan elements;
a pipelined test access mechanism (TAM) having a plurality of pipeline stages coupled together in a serial configuration, each of the plurality of pipeline stages corresponding to a unique one of the plurality of processor cores, wherein the pipelined TAM includes a command channel, a scan data input (SDI) channel, a scan data output (SDO) channel that is separate from the SDI channel, and a compare channel, wherein each of the plurality of pipeline stages includes a command register coupled to receive commands from upstream in the command channel, and further coupled to convey commands to a corresponding one of the plurality of processor cores and separately and concurrently convey commands downstream into the command channel, and wherein each of the plurality of pipeline stages is operable to:

convey commands to its corresponding one of the plurality of processor cores via the command channel;

convey scan input data to its corresponding one of the plurality of processor cores via the SDI channel;

receive scan output data conveyed from its corresponding one of the plurality of processor cores, wherein the scan output data is conveyed to the SDO channel and the compare channel; and convey compare data downstream via the compare channel, wherein the compare data is based on the scan output data.

2. The processor as recited in claim 1, wherein each of the plurality of pipeline stages includes a command decoder coupled between the command register and its corresponding one of the plurality of processor cores.

3. The processor as recited in claim 1, wherein each of the plurality of pipeline stages includes an SDI register coupled to receive the scan input data from upstream in the SDI channel, and operable to convey the scan input data to its corresponding one of the plurality of processor cores, and further configured to convey scan input data downstream in the SDI channel.

4. The processor as recited in claim 1, wherein each of the plurality of pipeline stages includes an SDO register operable to receive the scan output data from its corresponding one of its plurality of processor cores and further operable to convey the scan output data downstream in the SDO channel.

5. The processor as recited in claim 4, wherein each of the plurality of pipeline stages includes a comparator operable to receive scan output data from its corresponding one of the plurality of processor cores, and further operable to receive upstream scan output data from upstream in the SDO channel;

wherein the comparator is operable to compare the scan output data from its corresponding one of the plurality of processor cores to the upstream scan data output received from upstream in the SDO channel in order to generate compare data indicating a result of the comparison and to convey the compare data downstream in the compare channel.

6. The processor as recited in claim 5, wherein each of the plurality of pipeline stages further includes:

match circuitry coupled to receive the compare data from the comparator and upstream match data from upstream in the compare channel, wherein the match circuitry is configured to generate downstream match data;

a match register coupled to receive the downstream match data from the match circuitry and further configured to convey the downstream match data in the match channel.

7. The processor as recited in claim 6, wherein each of the plurality of pipeline stages further includes bypass circuitry configured to, when enabled, cause upstream match data to bypass the match circuitry and to be received by the match register.

8. The processor as recited in claim 5, wherein each of the plurality of pipeline stages includes an error register coupled to the comparator, wherein the error register is configured to store information indicating whether errors occurred for a given test of its corresponding one of the plurality of processor cores.

9. The processor as recited in claim 5, wherein each of the plurality of pipeline stages includes a first selection circuit configured to convey, to the comparator, the upstream scan output data received from upstream in the SDO channel or the scan output data received from its SDO register.

10. The processor as recited in claim 5, wherein each of the plurality of pipeline stages includes selection circuitry, wherein the selection circuitry is configured to:

in a first state, convey upstream scan output data received from upstream in the SDO channel to the SDO register;

in a second state, convey scan output data received from its corresponding one of the plurality of processor cores to the SDO register; and in a third state, convey data received from the SDI channel to the SDO register.

11. The processor as recited in claim 5, wherein each of the plurality of pipeline stages further comprises a mask register coupled to receive the scan input data from the SDI channel, wherein the mask register is operatively coupled to provide mask data to the comparator in order to prevent selected bit positions from mismatching.

12. The processor as recited in claim 1, wherein the pipelined TAM is configurable to operate in a self-compare mode wherein respective scan output data for each of the plurality of pipeline stages is compared to expected data.

13. The processor as recited in claim 1, wherein the pipelined TAM is configurable to operate in an interleaved self-compare mode, for a first cycle, no operation is applied to at least a first processor core and a comparison is performed for a second processor core, and for a second cycle, a comparison is performed for the first processor core while no operation is performed for the second processor core.

14. The processor as recited in claim 1, wherein the pipelined TAM is configurable to operate in an inter-core compare mode wherein test results obtained from one of the plurality of processor cores are compared to test results obtained from at least one of the other ones of the plurality of processor cores.

15. An integrated circuit comprising:

a plurality of logic units each of which is identical to one another, wherein each of the logic units includes a scan chain having a plurality of serially-coupled scan elements;

a pipelined test access mechanism (TAM) having a plurality of pipeline stages each corresponding to one of the plurality of logic units, wherein the pipelined TAM includes a command channel, a scan data input (SDI) channel, a scan data output (SDO) channel that is separate from the SDI channel, and a compare channel, wherein each of the plurality of pipeline stages includes a command register coupled to receive commands from upstream in the command channel, and further coupled to convey commands to its corresponding one of the plurality of logic units and separately and concurrently convey commands downstream in the command channel, and a command decoder coupled between the command register and the corresponding one of the plurality of logic units, and wherein each of the plurality of pipeline stages is operable to:

convey commands to its corresponding one of the plurality of logic units via the command channel;

convey scan input data to its corresponding one of the plurality of logic units via the SDI channel;

receive scan output data conveyed from its corresponding one of the plurality of logic units to the SDO channel and the compare channel; and convey compare data downstream via the compare channel, wherein the compare data is based on the scan output data.

16. The integrated circuit as recited in claim 15, wherein each of the plurality of pipeline stages includes an SDI register coupled to receive the scan input data from upstream in the SDI channel, and operable to convey the scan input data to its corresponding logic unit and downstream in the SDI channel.

17. The integrated circuit as recited in claim 15, wherein each of the plurality of pipeline stages includes an SDO register operable to receive scan output data from its corresponding one of the plurality of logic units and further operable to convey the scan output data received from its corresponding one of the plurality of logic units downstream in the SDO channel.

18. The integrated circuit as recited in claim 15, wherein each of the plurality of pipeline stages includes a comparator operable to receive scan output data from its corresponding one of the plurality of logic units, and further operable to receive scan output data from upstream in the SDO channel;
wherein the comparator is operable to compare the scan output data from its corresponding one of the plurality of logic units to the scan data output received from upstream in the SDO channel in order to generate compare data indicating a result of the comparison and to convey the compare data downstream in the compare channel and to an error register.

19. The processor as recited in claim 1, wherein at least one the plurality of pipeline stages is configured to:
convey scan input data downstream to another one of the plurality of pipeline stages, via the SDI channel, separately from and concurrently with scan data input conveyed into its corresponding one of the plurality of processor cores; and
convey commands downstream to another one of the plurality of pipeline stages, via the command channel, separately from and concurrently with commands conveyed into its corresponding one of the plurality of processor cores.

20. The integrated circuit as recited in claim 15, at least of the plurality of pipeline stages is configured to:
convey scan input data downstream to another one of the plurality of pipeline stages, via the SDI channel, separately from and concurrently with scan data input conveyed into its corresponding one of the plurality of logic units; and
convey commands downstream to another one of the plurality of pipeline stages, via the command channel, separately from and concurrently with commands conveyed into its corresponding one of the plurality of logic units.

* * * * *